(12) United States Patent
Chen

(10) Patent No.: US 8,740,631 B2
(45) Date of Patent: Jun. 3, 2014

(54) ELECTRICAL CONNECTOR ASSEMBLY

(75) Inventor: Chih-Jung Chen, Taipei (TW)

(73) Assignee: Bing Xu Precision Co. Ltd., Taipei (TW)

( * ) Notice: Subject to any disclaimer, the term of this patent is extended or adjusted under 35 U.S.C. 154(b) by 0 days.

(21) Appl. No.: 13/609,584

(22) Filed: Sep. 11, 2012

(65) Prior Publication Data

US 2013/0109244 A1 May 2, 2013

(30) Foreign Application Priority Data

Oct. 28, 2011 (TW) .................................. 100220391

(51) Int. Cl.
*H01R 12/00* (2006.01)
(52) U.S. Cl.
USPC .......................................................... 439/76.1
(58) Field of Classification Search
CPC ... H01R 12/613; H01R 12/62; H01R 13/6658
USPC ........................................ 439/492, 493, 76.1
See application file for complete search history.

(56) References Cited

U.S. PATENT DOCUMENTS

| | | | | |
|---|---|---|---|---|
| 6,695,641 B1 * | 2/2004 | Lee | | 439/493 |
| 6,832,931 B1 * | 12/2004 | Wu | | 439/499 |
| 6,948,949 B1 * | 9/2005 | Schwartz et al. | | 439/76.1 |
| 6,976,869 B1 * | 12/2005 | Wu | | 439/499 |
| 7,465,189 B2 * | 12/2008 | Marcade et al. | | 439/567 |
| 7,467,953 B2 * | 12/2008 | Kuo et al. | | 439/67 |
| 7,484,994 B2 | 2/2009 | Ko | | |
| 7,553,191 B2 * | 6/2009 | Su et al. | | 439/637 |
| 7,563,108 B1 * | 7/2009 | Wu | | 439/76.1 |
| 7,585,184 B2 * | 9/2009 | Su et al. | | 439/579 |
| 7,607,930 B1 * | 10/2009 | Wu | | 439/247 |
| 7,618,282 B2 | 11/2009 | Wu et al. | | |
| 7,682,162 B2 * | 3/2010 | Yuan | | 439/76.1 |
| 7,708,587 B2 * | 5/2010 | Wu | | 439/492 |
| 7,753,737 B2 * | 7/2010 | Yang et al. | | 439/660 |
| 7,794,273 B2 * | 9/2010 | Xu et al. | | 439/555 |
| 7,803,009 B2 * | 9/2010 | Su et al. | | 439/492 |
| 7,815,459 B2 * | 10/2010 | Chen et al. | | 439/351 |
| 7,938,668 B2 * | 5/2011 | Chen et al. | | 439/351 |
| 8,007,324 B2 * | 8/2011 | Wang et al. | | 439/660 |
| 8,202,127 B2 * | 6/2012 | Zhang et al. | | 439/660 |
| 8,342,886 B2 * | 1/2013 | Zhang et al. | | 439/660 |
| 8,512,071 B2 * | 8/2013 | Tseng et al. | | 439/493 |
| 8,523,608 B2 * | 9/2013 | Fu | | 439/545 |
| 2005/0101184 A1 * | 5/2005 | Chang et al. | | 439/564 |
| 2005/0272303 A1 * | 12/2005 | Wu | | 439/499 |
| 2006/0079119 A1 * | 4/2006 | Wu | | 439/492 |
| 2006/0094267 A1 * | 5/2006 | Li | | 439/76.1 |
| 2006/0110972 A1 * | 5/2006 | Wu | | 439/358 |
| 2006/0276083 A1 * | 12/2006 | Sun | | 439/638 |
| 2006/0286860 A1 * | 12/2006 | Sun | | 439/499 |
| 2007/0026715 A1 * | 2/2007 | Huang et al. | | 439/260 |
| 2007/0254496 A1 * | 11/2007 | Koiwaya | | 439/31 |
| 2008/0176442 A1 * | 7/2008 | Kuo et al. | | 439/494 |
| 2008/0188136 A1 * | 8/2008 | Su et al. | | 439/660 |
| 2008/0214054 A1 * | 9/2008 | Su et al. | | 439/637 |

(Continued)

*Primary Examiner* — Ross Gushi
(74) *Attorney, Agent, or Firm* — Mark M. Friedman

(57) ABSTRACT

An electrical connector assembly is provided with an insulating housing, a PCB, and an FFC. The insulating housing includes a plurality of terminals. The FFC and the terminals are electrically connected together by the PCB. The PCB is vertically secured to a rear end of the insulating housing. A plurality of contacts of the PCB are provided on a rear surface of the PCB.

19 Claims, 8 Drawing Sheets

(56) References Cited

U.S. PATENT DOCUMENTS

| | | | |
|---|---|---|---|
| 2009/0068896 A1* | 3/2009 | Zhang | 439/626 |
| 2009/0130878 A1* | 5/2009 | Xu et al. | 439/157 |
| 2009/0215295 A1* | 8/2009 | Tseng | 439/247 |
| 2009/0301761 A1* | 12/2009 | Wu | 174/250 |
| 2010/0009569 A1* | 1/2010 | Su et al. | 439/552 |
| 2010/0035477 A1* | 2/2010 | Yuan | 439/638 |
| 2010/0188826 A1 | 7/2010 | Yeh | |
| 2011/0076865 A1* | 3/2011 | Luo et al. | 439/82 |
| 2012/0009825 A1* | 1/2012 | Chen | 439/660 |
| 2012/0077389 A1* | 3/2012 | Zhang et al. | 439/660 |
| 2012/0100760 A1* | 4/2012 | Liu et al. | 439/660 |
| 2012/0108109 A1* | 5/2012 | Zhang et al. | 439/629 |
| 2012/0252260 A1* | 10/2012 | Tseng et al. | 439/499 |
| 2012/0282808 A1* | 11/2012 | Luo et al. | 439/607.28 |
| 2013/0065432 A1* | 3/2013 | Fu et al. | 439/569 |
| 2013/0109244 A1* | 5/2013 | Chen | 439/682 |
| 2013/0109245 A1* | 5/2013 | Tseng | 439/682 |
| 2013/0149895 A1* | 6/2013 | Fu | 439/545 |
| 2013/0217261 A1* | 8/2013 | CHEN et al. | 439/499 |
| 2013/0303018 A1* | 11/2013 | Tseng et al. | 439/492 |

\* cited by examiner

US 8,740,631 B2

ELECTRICAL CONNECTOR ASSEMBLY

BACKGROUND OF THE INVENTION

1. Field of the Invention

The invention relates to electrical connectors assembly and more particularly to a SATA (Serial Advanced Technology Attachment) connector assembly having a flex flat cable and a printed circuit board which is vertically secured to an insulating housing of the connector assembly and a plurality of contacts of the PCB are provided on a rear surface of the PCB.

2. Description of Related Art

The disclosure of Taiwan Utility Model No. M413,241 entitled "electrical connector assembly", filed Mar. 28, 2011, is incorporated herein by reference in its entirety. The electrical connector assembly comprises an insulating housing, a printed circuit board (PCB), and a flexible (or flex) flat cable (FFC). The insulating housing includes a plurality of terminals. The FFC and the terminals are electrically connected together by the PCB. The PCB is secured to the insulating housing.

However, a couple of drawbacks have been found in the electrical connector assembly. First, it is not easy to inspect the fastening of the PCB and the FFC and the electrical connection thereof. Second, a rated (i.e., maximum) current flowing through the terminals are limited. Thus, the improvement still exists.

SUMMARY OF THE INVENTION

It is therefore an object of the invention to provide an electrical connector assembly comprising an insulating housing, a printed circuit board (PCB), and a flex flat cable (FFC). The insulating housing includes a plurality of terminals. The FFC and the terminals are electrically connected together by the PCB. The PCB is vertically secured to a rear end of the insulating housing. A plurality of contacts of the PCB are provided on a rear surface of the PCB.

First advantages provided by the invention comprise easy assembly and inspecting electrical contacts with a plurality of contacts of the PCB exposed on the insulating housing when the FFC and the PCB are electrically connected together in the assembly.

Second advantages provided by the invention comprise easy adhesive coating and inspection of the fastening of the adhesive when the adhesive is coated on one ends of the FFC with the plurality of contacts of the PCB exposed on the insulating housing.

Third advantages provided by the invention comprise the second soldering holes of the PCB are electrically connected to the second contacts of the PCB, and the number of the second contacts is greater than that of the second soldering holes, thereby increasing a maximum current flowing through the second soldering holes.

It is a first aspect of the invention to provide an electrical connector assembly comprising an insulating housing comprising a plurality of terminal holes; a printed circuit board (PCB) comprising a plurality of first, second, third, and fourth soldering holes and a plurality of first, second, third, and fourth contacts wherein the PCB is vertically secured to a rear end of the insulating housing, a front surface of the PCB faces interior of the insulating housing, and a rear surface of the PCB is distal the rear end of the insulating housing; a plurality of terminals fastened in the terminal holes respectively, each terminal comprising a mating portion at one end fastened in one of the terminal holes, and a soldering portion at the other end soldered in one of the first, second, third, and fourth soldering holes; and a flex flat cable (FFC) comprising a plurality of conductors and an insulating layer for enclosing substantial portions of the conductors; wherein the first, second, third, and fourth contacts are disposed on the rear surface of the PCB, and exposed portion at one end of each conductor is electrically connected to one of the first, second, third, and fourth contacts of the PCB.

It is a second aspect of the invention to provide an electrical connector assembly comprising an insulating housing comprising a plurality of terminal holes; a printed circuit board (PCB) comprising a plurality of first and second soldering holes and a plurality of first and second contacts wherein the PCB is vertically secured to a rear end of the insulating housing, a front surface of the PCB faces interior of the insulating housing, and a rear surface of the PCB is distal the rear end of the insulating housing; and a plurality of terminals fastened in the terminal holes respectively, each terminal comprising a mating portion at one end fastened in one of the terminal holes, and a soldering portion at the other end soldered in one of the first, second, third, and fourth soldering holes; wherein the first and second contacts are disposed on the rear surface of the PCB, soldering holes of the first soldering holes on the rear surface of the PCB are electrically connected to contacts of the first contacts respectively, the second soldering holes on the rear surface of the PCB are electrically connected to the second contacts, and the number of the second contacts is greater than that of the second soldering holes.

It is a third aspect of the invention to provide an electrical connector assembly comprising an insulating housing comprising a plurality of terminal holes; a printed circuit board (PCB) comprising a plurality of first and second soldering holes and a plurality of first and second contacts wherein the PCB is vertically secured to a rear end of the insulating housing, a front surface of the PCB faces interior of the insulating housing, and a rear surface of the PCB is distal the rear end of the insulating housing; and a plurality of terminals fastened in the terminal holes respectively, each terminal comprising a mating portion at one end fastened in one of the terminal holes, and a soldering portion at the other end soldered in one of the first, second, third, and fourth soldering holes; wherein the first and second contacts are disposed on the rear surface of the PCB, soldering holes of the first soldering holes on the front surface of the PCB are electrically connected to contacts of the first contacts respectively, the second soldering holes on the front surface of the PCB are electrically connected to the second contacts, and the number of the second contacts is greater than that of the second soldering holes.

The above and other objects, features and advantages of the invention will become apparent from the following detailed description taken with the accompanying drawings.

DETAILED DESCRIPTION OF THE INVENTION

Figure 1:
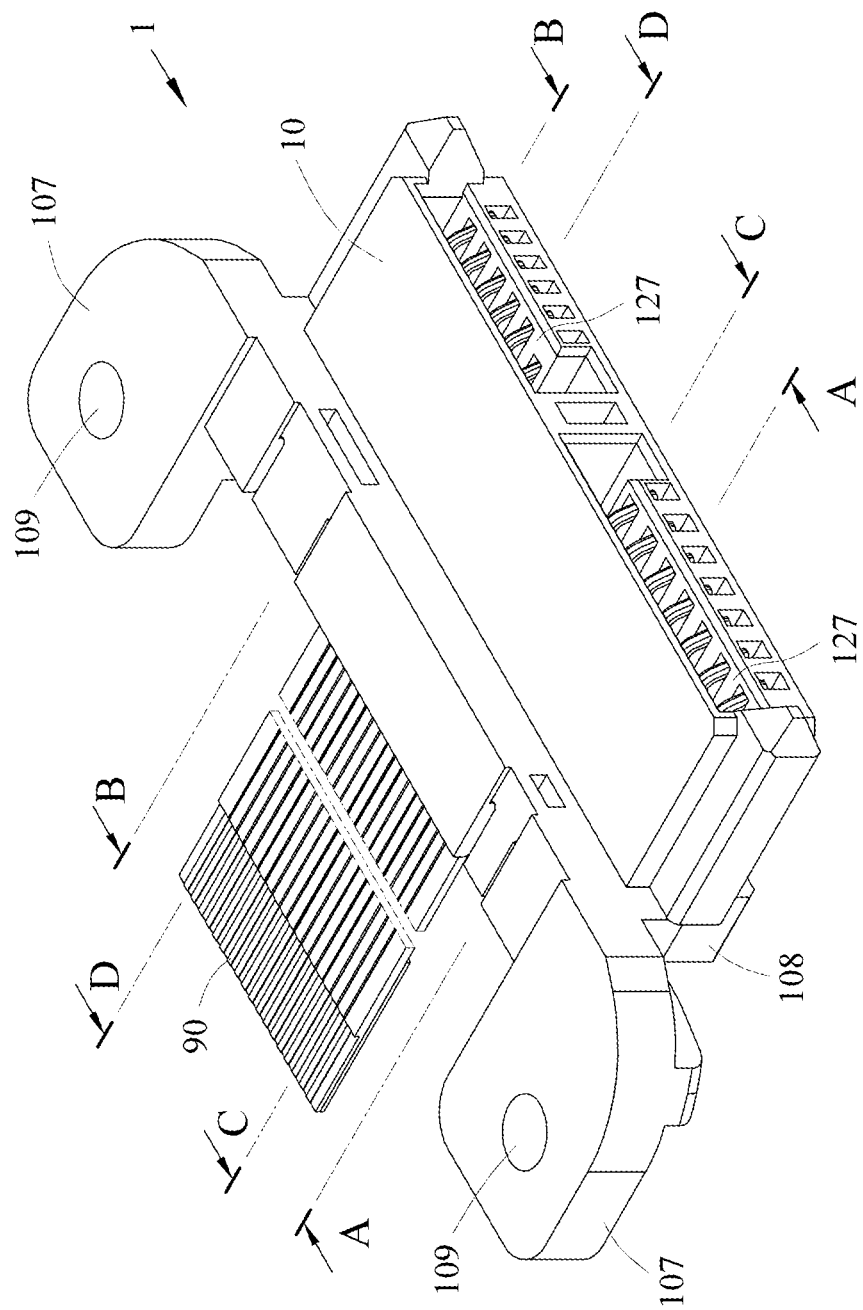
FIG. 1 is a perspective view of an electrical connector assembly according to a first preferred embodiment of the invention.
Figure 2:
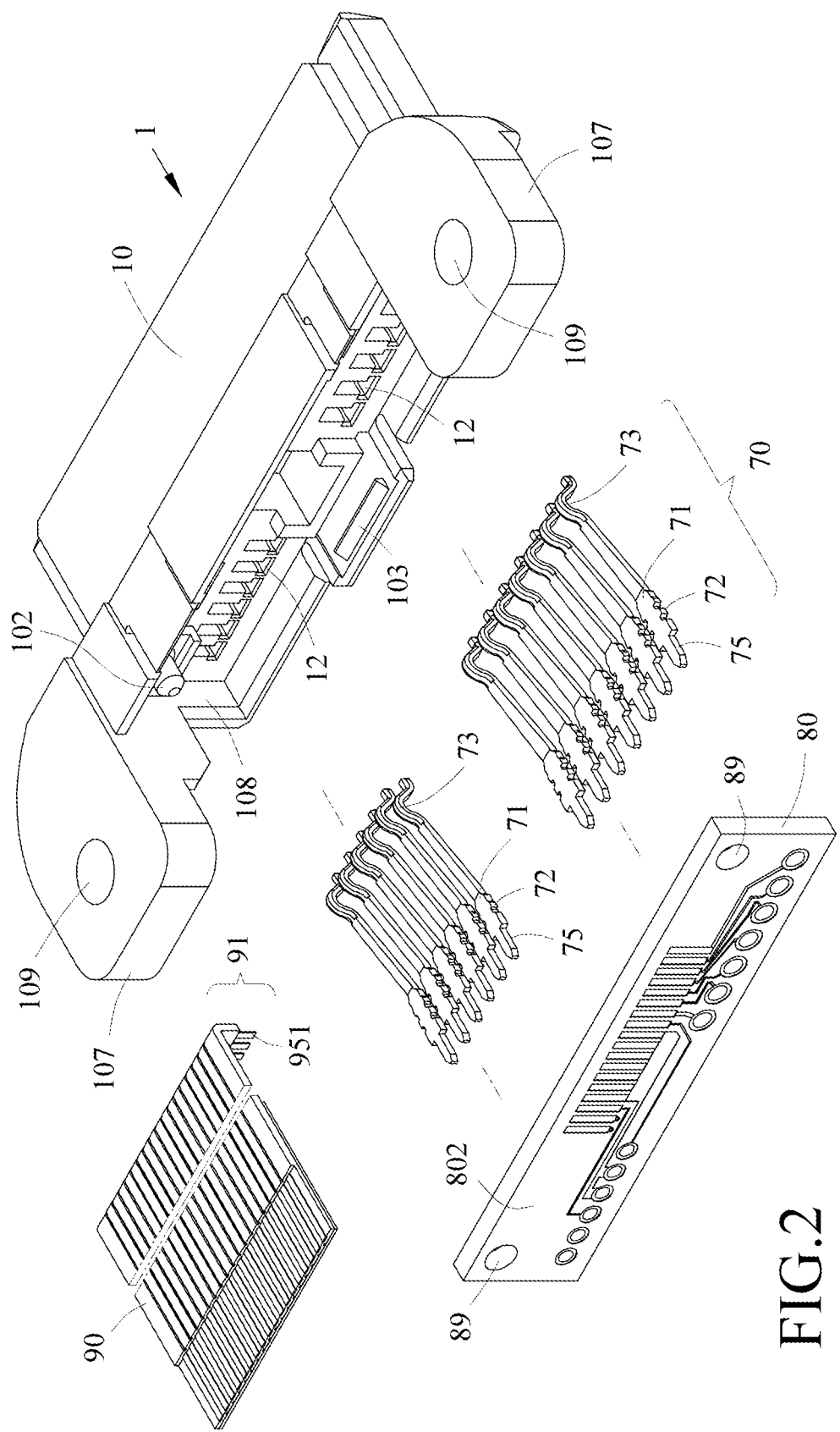
FIG. 2 is an exploded view of the electrical connector assembly of FIG. 1.
Figure 3:
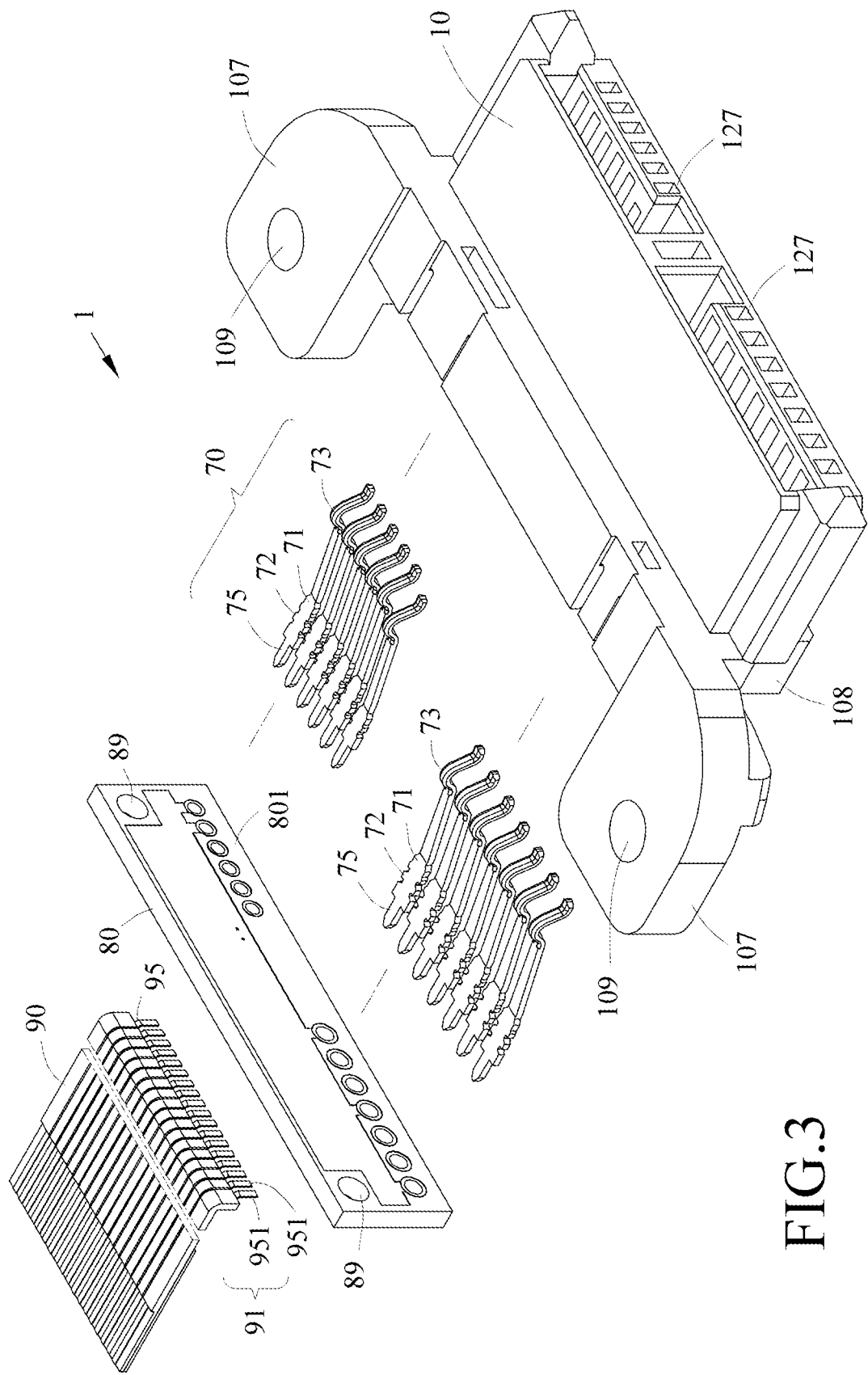
FIG. 3 is another exploded view of the electrical connector assembly of FIG. 1.

Referring to FIGS. 1 to 9, an electrical connector assembly (e.g., SATA connector) 1 in accordance with a first preferred embodiment of the invention comprises an insulating housing 10, a plurality of terminals 70, a printed circuit board (PCB) 80, and a (flex or flexible) flat cable) FFC 90. Each component will be discussed in detail below.

The insulating housing 10 comprises two extensions 107 on both sides respectively, each extension 107 having a vertical positioning hole 109. The PCB 80 comprises a plurality of first soldering holes 81, a plurality of second soldering holes 82, a plurality of third soldering holes 83, and a plurality of fourth soldering holes 84. The rectangular PCB 80 is a vertically secured to a rear end 108 of the insulating housing 10. A front surface 801 of the PCB 80 faces interior of the insulating housing 10 and a rear surface 802 thereof is distal the interior of the insulating housing 10. A plurality of first contacts 85, a plurality of second contacts 86, a plurality of third contacts 87, and a plurality of fourth contacts 88 are provided on the rear surface 802 of the PCB 80.

Each terminal 70 comprises a root 71 proximate one end and having a plurality of projections 72 on both sides respectively inserted in one of a plurality of rear holes 12 in the insulating housing 10 for fastening, a curved mating portion 73 at the other end, the mating portion 73 being inserted into one of a plurality of front terminal holes 127 of the insulating housing 10 for fastening, and a soldering portion 75 at one end and soldered in one of the first, second, third, and fourth soldering holes 81, 82, 83 and 84. The terminal holes 127 communicate with the holes 12 respectively.

The FFC 90 comprises a plurality of conductors 95 and an insulating layer 901 for enclosing substantial portions of the conductors 95. The first contacts 85, the second contacts 86, the third contacts 87, and the fourth contacts 88 are provided on the rear surface 802 of the PCB 80. Exposed portion 951 of each conductor 95 at one end 91 of the FFC 90 is electrically connected to one of the first, second, third, and fourth contacts 85, 86, 87, and 88. Adhesive 96 may be coated on the conductors 95 at one end 91 of the FFC 90 to secure the FFC 90 to the PCB 80. The adhesive 96 may be AB adhesive, UV adhesive, hot melt type adhesive, quick dry adhesive, or any of other adhesives for fastening and protecting the FFC 90. The FFC 90 and the PCB 80 are thus electrically fastened and connected together with the first, second, third, and fourth contacts 85, 86, 87, and 88 being exposed on the insulating housing 10. This has the benefits of easy assembly and inspecting the electrical contacts. Moreover, the first, second, third, and fourth contacts 85, 86, 87, and 88 are exposed on the insulating housing 10 with the adhesive 96 coated on one end 91 of the FFC 90 being facilitated and inspection of the fastening being made reliable.

Figure 4:
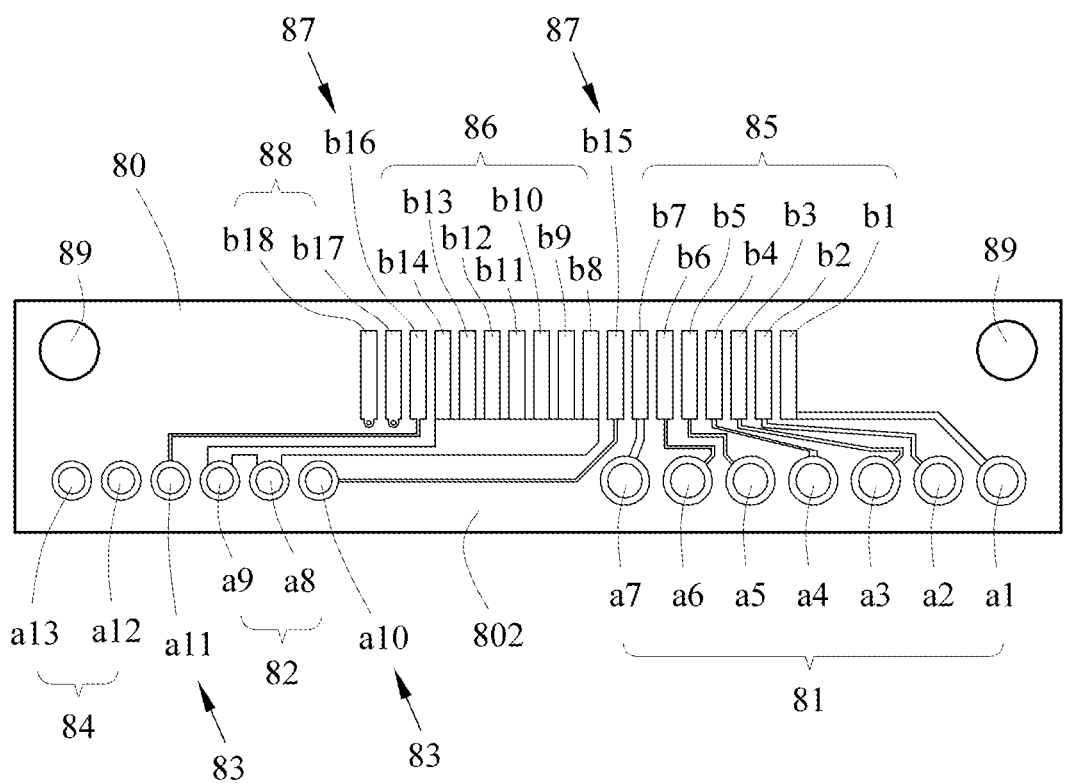
FIG. 4 is a rear view of the PCB of FIG. 2.
Figure 5:
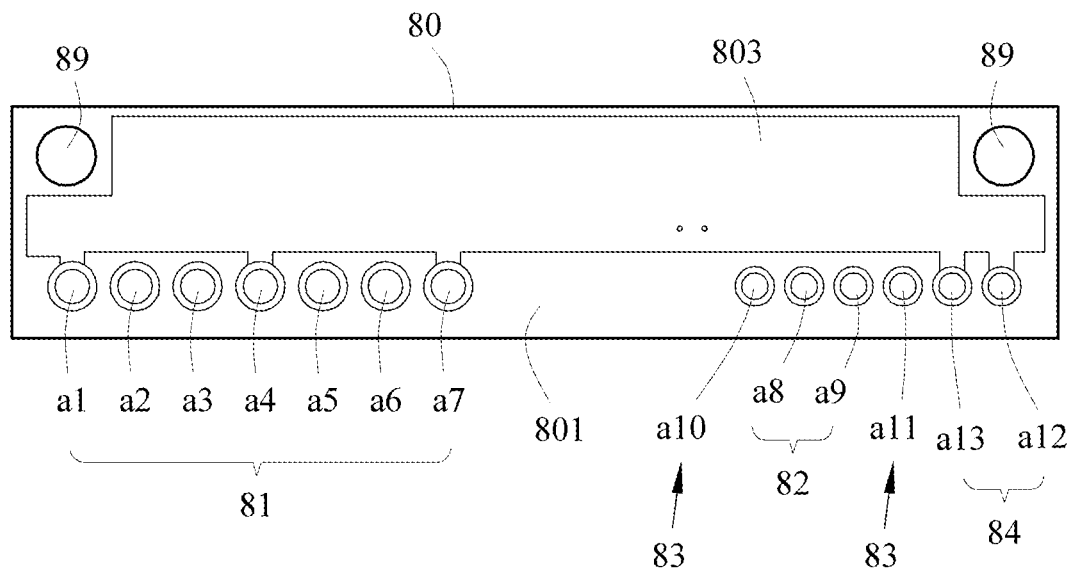
FIG. 5 is a front view of the PCB of FIG. 2.
Figure 6:
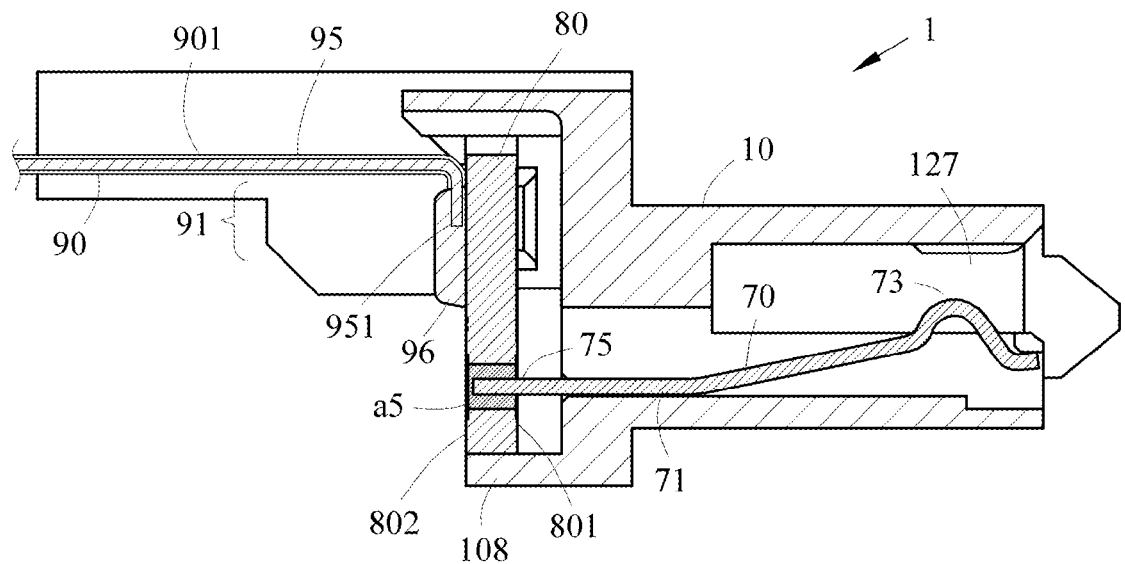
FIG. 6 is a sectional view taken along line A-A of FIG. 1.
Figure 7:
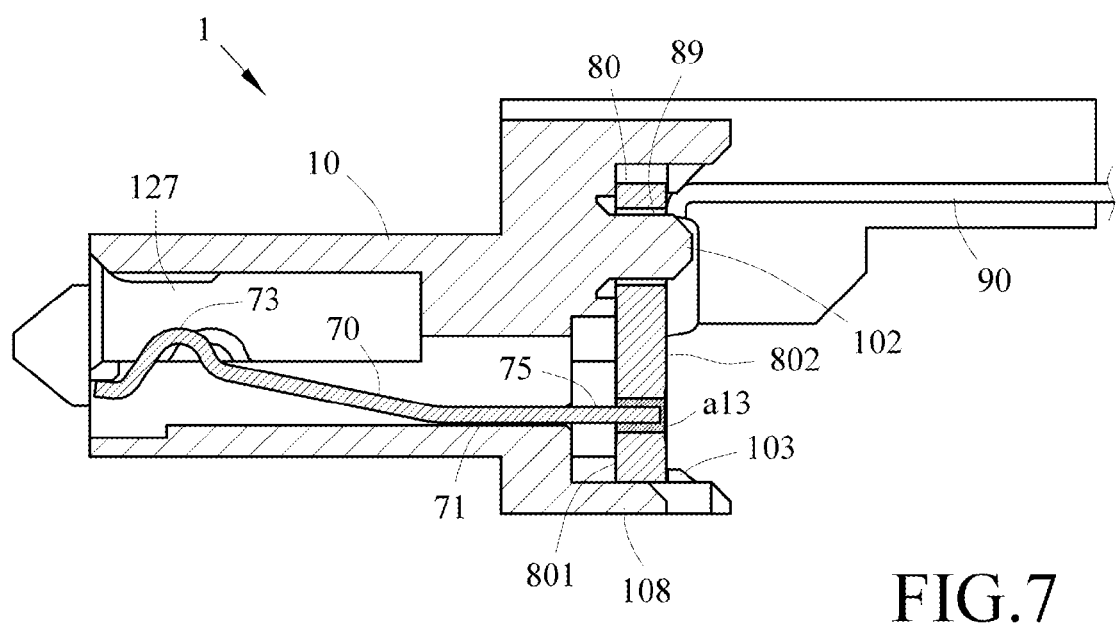
FIG. 7 is a sectional view taken along line B-B of FIG. 1.
Figure 8:
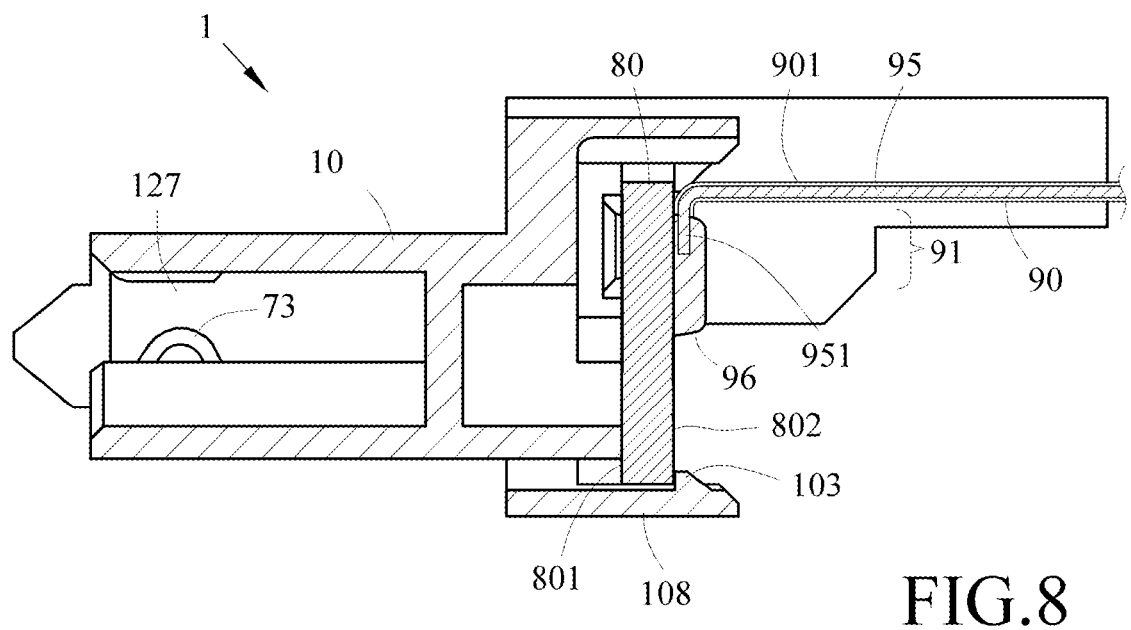
FIG. 8 is a sectional view taken along line C-C of FIG. 1.
Figure 9:
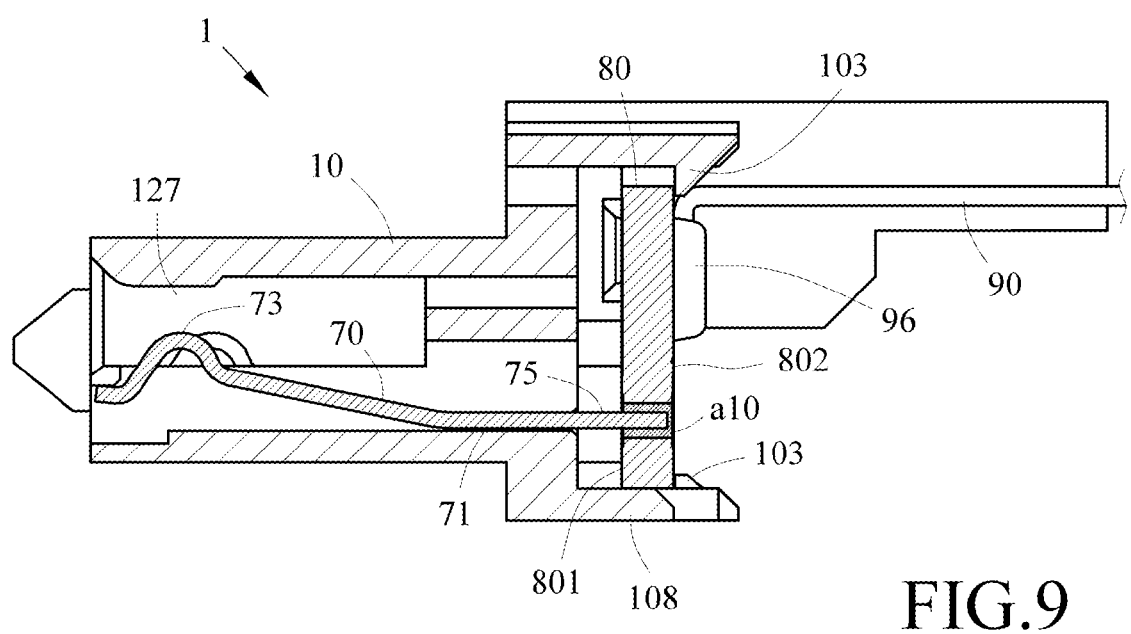
FIG. 9 is a sectional view taken along line D-D of FIG. 1.

As shown in FIGS. 4 and 5 specifically, in the first preferred embodiment, soldering holes a1, a2, a3, a4, a5, a6 and a7 of the first soldering holes 81 on the rear surface 802 of the PCB 80 are electrically connected to contacts b1, b2, b3, b4, b5, b6 and b7 of the first contacts 85 respectively. A ground member 803 is provided on the front surface 801 of the PCB 80. Three soldering holes a1, a4 and a7 of the first soldering holes 81 are electrically connected to the ground member 803 respectively. Soldering holes a8 and a9 of the second soldering holes 82 on the rear surface 802 of the PCB 80 are electrically connected to contacts b8, b9, b10, b11, b12, b13 and b14 of the second contacts 86 respectively. The number of the contacts of the second contacts 86 is greater than that of the soldering holes of the second soldering holes 82 so that a maximum current flowing through the second soldering holes 82 can be increased. Soldering holes a10 and a11 of the third soldering holes 83 on the rear surface 802 of the PCB 80 are electrically connected to contacts b15 and b16 of the third contacts 87 respectively. The second contacts 82 include a plurality of contacts such as contacts a8 and a9. The second contacts 86 include at least 7 contacts such as contacts b8, b9, b10, b11, b12, b13 and b14. For example, a rated (i.e., maximum) current of each contact is 0.5 A and then a rated (i.e., maximum) current of the seven contacts is 3.5 A. A maximum current of the contacts a8, a9 is 3.5 A. Further, soldering holes of the fourth soldering holes 84 are electrically connected to the ground member 803 respectively. The fourth contacts 88 are electrically connected to the ground member 803 respectively. The fourth soldering holes 84 include a plurality of soldering holes such as soldering holes a12 and a13. The fourth contacts 88 include a plurality of contacts such as contacts b17 and b18.

As shown in FIGS. 6 to 9 specifically, in the first preferred embodiment, the fastening of the PCB 80 and the insulating housing 10 is detailed below. The insulating housing 10 comprises, on its rear end 108, two side pins 102 and an intermediate latch 103. The PCB 80 comprises two side pin holes 89. In assembly, the pin holes 89 of the PCB 80 are securely put on the pins 102 and the latch 103 is pressed to clamp a bottom edge of the PCB 80.

Figure 10:
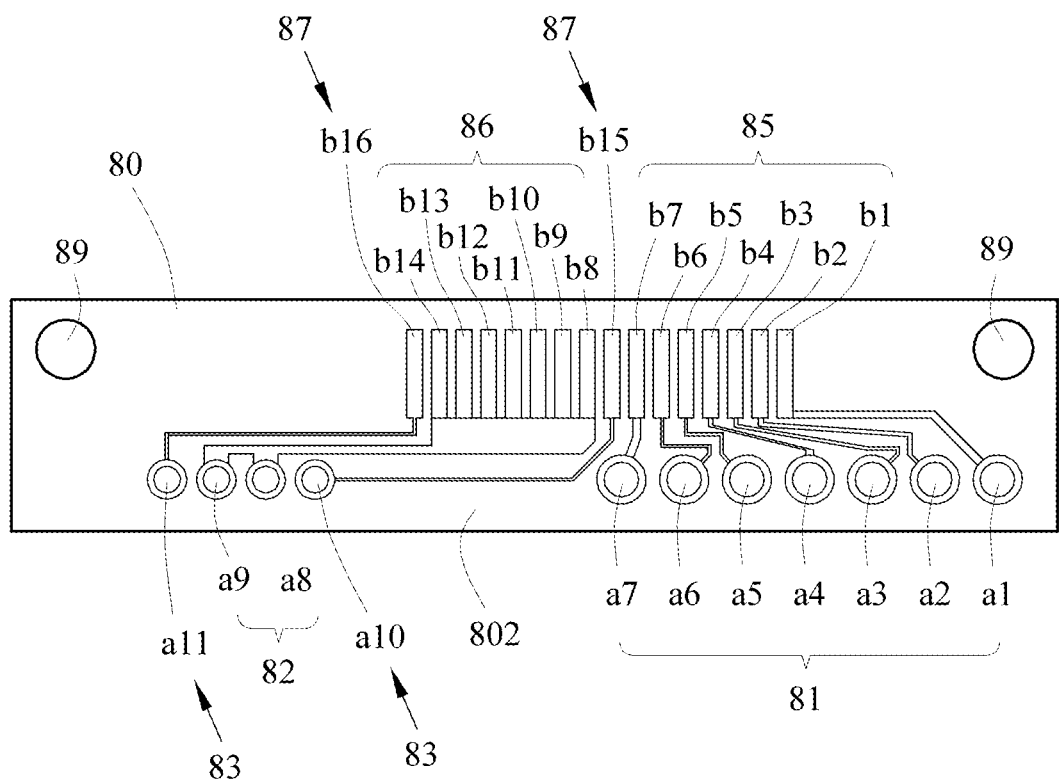
FIG. 10 is a rear view of a PCB of an electrical connector assembly according to a second preferred embodiment of the invention.
Figure 11:
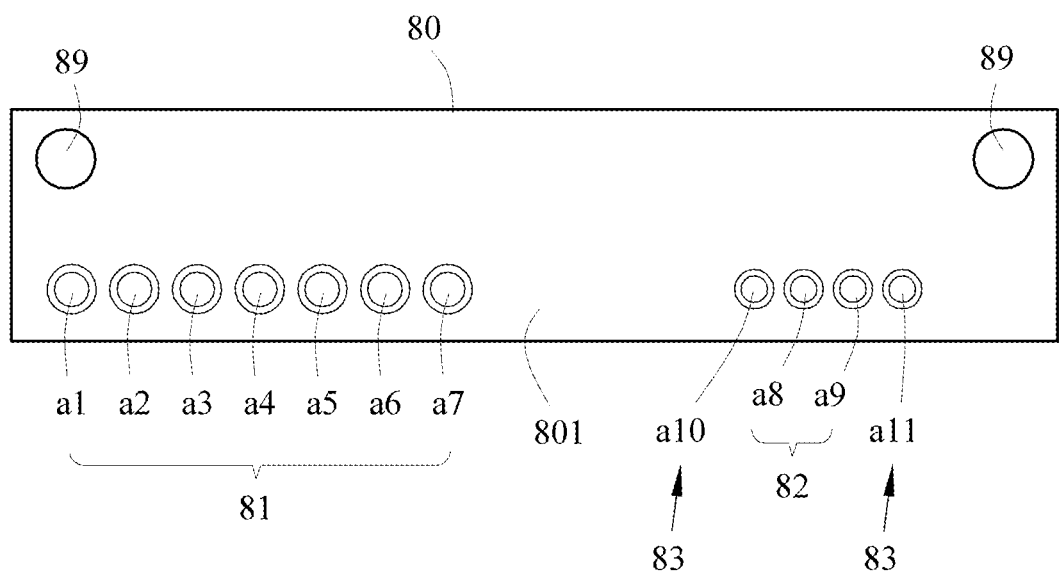
FIG. 11 is a front view of the PCB of FIG. 10.

Referring to FIGS. 10 and 11, an electrical connector assembly 1 in accordance with a second preferred embodiment of the invention is shown. The characteristics of the second preferred embodiment are substantially the same as that of the first preferred embodiment except the following:

The ground member 803 (see FIGS. 5 and 6) of the PCB 80 are eliminated. The fourth soldering holes 84 include soldering holes a12 and a13 and the fourth contacts 88 include contacts b17 and b18.

Figure 12:
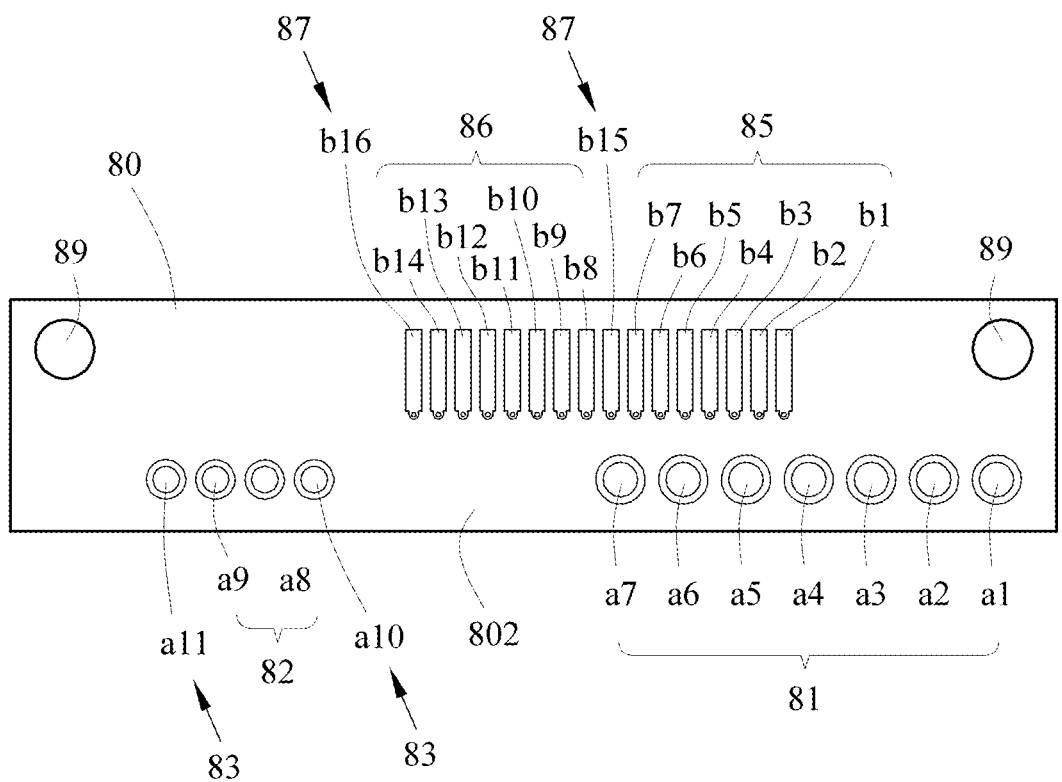
FIG. 12 is a rear view of a PCB of an electrical connector assembly according to a third preferred embodiment of the invention.
Figure 13:
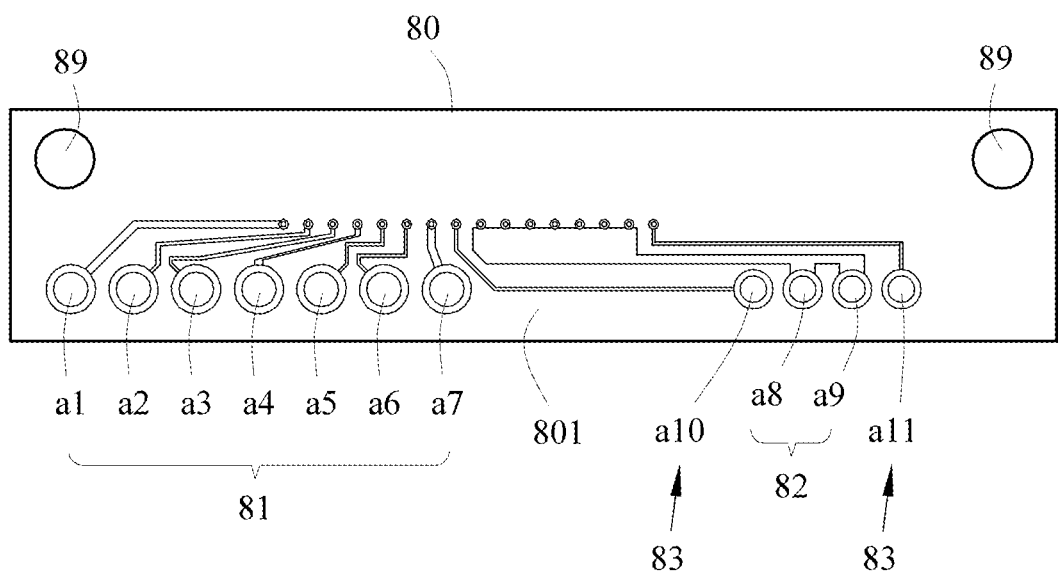
FIG. 13 is a front view of the PCB of FIG. 12.

Referring to FIGS. 12 and 13, an electrical connector assembly 1 in accordance with a third preferred embodiment of the invention is shown. The characteristics of the third preferred embodiment are substantially the same as that of the first preferred embodiment except the following:

Soldering holes a1, a2, a3, a4, a5, a6 and a7 of the first soldering holes 81 on the front surface 801 of the PCB 80 are electrically connected to contacts b1, b2, b3, b4, b5, b6 and b7 of the first contacts 85 respectively. Soldering holes a8 and a9 of the second soldering holes 82 on the front surface 801 of the PCB 80 are electrically connected to contacts b8, b9, b10, b11, b12, b13 and b14 of the second contacts 86 respectively. Soldering holes a10 and a11 of the third soldering holes 83 on the front surface 801 of the PCB 80 are electrically connected to contacts b15 and b16 of the third contacts 87 respectively. The second soldering holes 82 include a plurality of soldering holes such as soldering holes a8 and a9. The second contacts 86 include at least seven contacts such as contacts b8, b9, b10, b11, b12, b13 and 14.

While the invention has been described in terms of preferred embodiments, those skilled in the art will recognize that the invention can be practiced with modifications within the spirit and scope of the appended claims.

What is claimed is:

1. An electrical connector assembly comprising:
   an insulating housing (10) comprising a plurality of terminal holes (127);
   a printed circuit board (PCB) (80) comprising a plurality of first, second, third, and fourth soldering holes (81, 82, 83, and 84) and a plurality of first, second, third, and fourth contacts (85, 86, 87, and 88) wherein the PCB (80) is vertically secured to a rear end (108) of the insulating housing (10), a front surface (801) of the PCB (80) faces interior of the insulating housing (10), and a rear surface (802) of the PCB (80) is distal the rear end (108) of the insulating housing (10);
   a plurality of terminals (70) fastened in the terminal holes (127) respectively, each terminal (70) comprising a mating portion (73) at one end fastened in one of the terminal holes (127), and a soldering portion (75) at the other end soldered in one of the first, second, third, and fourth soldering holes (81, 82, 83, 84);
   a flex flat cable (FFC) (90) comprising a plurality of conductors (95) and an insulating layer (901) for enclosing substantial portions of the conductors (95);
   wherein the first, second, third, and fourth contacts (85, 86, 87, and 88) are disposed on the rear surface (802) of the PCB (80), and exposed portion (951) of each conductor (95) at one end (91) of the FFC (90) is electrically connected to one of the first, second, third, and fourth contacts (85, 86, 87, and 88) of the PCB (80); and
   an adhesive (96) coated on the conductors (95) at one end (91) of the FFC (90) to secure the FFC (90) to the PCB (80), wherein the adhesive (96) is AB adhesive, UV adhesive, hot melt type adhesive, quick dry adhesive, or any of other adhesives for fastening and protecting the FFC (90).

2. The electrical connector assembly of claim 1, wherein soldering holes (a1, a2, a3, a4, a5, a6, and a7) of the first soldering holes (81) on the rear surface (802) of the PCB (80) are electrically connected to contacts (b1, b2, b3, b4, b5, b6, and b7) of the first contacts (85) respectively, furthering comprising a ground member (803) disposed on the front surface (801) of the PCB (80), and at least three soldering holes (a1, a4, and a7) of the first soldering holes (81) are electrically connected to the ground member (803) respectively.

3. The electrical connector assembly of claim 2, wherein the second soldering holes (82) of the first, second, third, and fourth soldering holes (81, 82, 83, 84) on the rear surface (802) of the PCB (80) are electrically connected to the second contacts (86) of the first, second, third, and fourth contacts (85, 86, 87, and 88), and the number of the second contacts (86) is greater than that of the second soldering holes (82).

4. The electrical connector assembly of claim 3, wherein the second soldering holes (82) comprises a plurality of soldering holes (a8 and a9), and the second contacts (86) comprises at least seven contacts (b8, b9, b10, b11, b12, b13, and b14).

5. The electrical connector assembly of claim 3, wherein the third soldering holes (83) of the first, second, third, and fourth soldering holes (81, 82, 83, 84) on the rear surface (802) of the PCB (80) are electrically connected to the third contacts (87) of the first, second, third, and fourth contacts (85, 86, 87, and 88).

6. The electrical connector assembly of claim 5, furthering comprising a ground member (803) disposed on the front surface (801) of the PCB (80), wherein the fourth soldering holes (84) of the first, second, third, and fourth soldering holes (81, 82, 83, and 84) are electrically connected to the ground member (803), and the fourth contacts (88) of the first, second, third, and fourth contacts (85, 86, 87, and 88) are electrically connected to the ground member (803).

7. The electrical connector assembly of claim 6, wherein the fourth soldering holes (84) comprise a plurality of soldering holes (a12 and a13), and the fourth contacts (88) comprise a plurality of contacts (b17 and b18).

8. The electrical connector assembly of claim 1, wherein the insulating housing (10) further comprises, on the rear end (108), two side pins (102) and an intermediate latch (103), the PCB (80) further comprises two side pin holes (89), and in assembly, the pin holes (89) of the PCB (80) are securely put on the side pins (102) and the intermediate latch (103) is pressed to clamp a bottom edge of the PCB (80); and wherein the insulating housing (10) further comprises two extensions (107) on both sides respectively, each extension (107) having a vertical positioning hole (109).

9. An electrical connector assembly comprising:
   an insulating housing (10) comprising a plurality of terminal holes (127);
   a printed circuit board (PCB) (80) comprising a plurality of first and second soldering holes (81 and 82) and a plurality of first and second contacts (85 and 86) wherein the PCB (80) is vertically secured to a rear end (108) of the insulating housing (10), a front surface (801) of the PCB (80) faces interior of the insulating housing (10), and a rear surface (802) of the PCB (80) is distal the rear end (108) of the insulating housing (10); and
   a plurality of terminals (70) fastened in the terminal holes (127) respectively, each terminal (70) comprising a mating portion (73) at one end fastened in one of the terminal holes (127), and a soldering portion (75) at the other end soldered in one of the first, second, third, and fourth soldering holes (81, 82, 83, 84);
   wherein the first and second contacts (85 and 86) are disposed on the rear surface (802) of the PCB (80), soldering holes (a1, a2, a3, a4, a5, a6, and a7) of the first soldering holes (81) on the rear surface (802) of the PCB (80) are electrically connected to contacts (b1, b2, b3, b4, b5, b6, and b7) of the first contacts (85) respectively, the second soldering holes (82) on the rear surface (802) of the PCB (80) are electrically connected to the second contacts (86), and the number of the second contacts (86) is greater than that of the second soldering holes (82).

10. The electrical connector assembly of claim 9, wherein the insulating housing (10) further comprises, on the rear end (108), two side pins (102) and an intermediate latch (103), the PCB (80) further comprises two side pin holes (89), and in assembly, the pin holes (89) of the PCB (80) are securely put on the side pins (102) and the intermediate latch (103) is pressed to clamp a bottom edge of the PCB (80).

11. The electrical connector assembly of claim 9, wherein the second soldering holes (82) comprises a plurality of soldering holes (a8 and a9), and the second contacts (86) comprises at least seven contacts (b8, b9, b10, b11, b12, b13, and b14).

12. The electrical connector assembly of claim 9, wherein the PCB (80) further comprises a plurality of third soldering holes (83) and a plurality of third contacts (87), the third soldering holes (83) on the rear surface (802) of the PCB (80) are electrically connected to the third contacts (87), and the third contacts (87) are disposed on the rear surface (802) of the PCB (80).

13. The electrical connector assembly of claim 12, further comprising a flex flat cable (FFC) (90) comprising a plurality of conductors (95) and an insulating layer (901) for enclosing substantial portions of the conductors (95), wherein exposed portion (951) of the conductors (95) at one end (91) of the FFC (90) is electrically connected to one of the first, second, and third contacts (85, 86, and 87).

14. An electrical connector assembly comprising:
an insulating housing (10) comprising a plurality of terminal holes (127);
a printed circuit board (PCB) (80) comprising a plurality of first and second soldering holes (81 and 82) and a plurality of first and second contacts (85 and 86) wherein the PCB (80) is vertically secured to a rear end (108) of the insulating housing (10), a front surface (801) of the PCB (80) faces interior of the insulating housing (10), and a rear surface (802) of the PCB (80) is distal the rear end (108) of the insulating housing (10); and
a plurality of terminals (70) fastened in the terminal holes (127) respectively, each terminal (70) comprising a mating portion (73) at one end fastened in one of the terminal holes (127), and a soldering portion (75) at the other end soldered in one of the first, second, third, and fourth soldering holes (81, 82, 83, 84);
wherein the first and second contacts (85 and 86) are disposed on the rear surface (802) of the PCB (80), soldering holes (a1, a2, a3, a4, a5, a6, and a7) of the first soldering holes (81) on the front surface (801) of the PCB (80) are electrically connected to contacts (b1, b2, b3, b4, b5, b6, and b7) of the first contacts (85) respectively, the second soldering holes (82) on the front surface (801) of the PCB (80) are electrically connected to the second contacts (86), and the number of the second contacts (86) is greater than that of the second soldering holes (82).

15. The electrical connector assembly of claim 14, wherein the second soldering holes (82) comprises a plurality of soldering holes (a8 and a9), and the second contacts (86) comprises at least seven contacts (b8, b9, b10, b11, b12, b13, and b14).

16. The electrical connector assembly of claim 14, wherein the PCB (80) further comprises a plurality of third soldering holes (83) and a plurality of third contacts (87), the third soldering holes (83) on the front surface (801) of the PCB (80) are electrically connected to the third contacts (87), and the third contacts (87) are disposed on the rear surface (802) of the PCB (80).

17. The electrical connector assembly of claim 14, further comprising a flex flat cable (FFC) (90) including a plurality of conductors (95) and an insulating layer (901) for enclosing substantial portions of the conductors (95), wherein exposed portion (951) of the conductors (95) at one end (91) of the FFC (90) is electrically connected to one of the first, second, and third contacts (85, 86, and 87).

18. The electrical connector assembly of claim 14, wherein the insulating housing (10) further comprises an intermediate latch (103) on the rear end (108), and in assembly, the intermediate latch (103) being pressed to clamp a bottom edge of the PCB (80); and wherein the insulating housing (10) further comprises two extensions (107) on both sides respectively, each extension (107) having a vertical positioning hole (109).

19. The electrical connector assembly of claim 14, wherein the insulating housing (10) further comprises two side pins (102) on the rear end (108), the PCB (80) further comprises two side pin holes (89), and in assembly, the pin holes (89) of the PCB (80) are securely put on the side pins (102); and wherein the insulating housing (10) further comprises two extensions (107) on both sides respectively, each extension (107) having a vertical positioning hole (109).

* * * * *